United States Patent
Waight

(10) Patent No.: US 6,181,216 B1
(45) Date of Patent: Jan. 30, 2001

(54) LOW PHASE-NOISE VOLTAGE CONTROLLED OSCILLATOR

(75) Inventor: Matthew Glenn Waight, Pipersville, PA (US)

(73) Assignee: General Instrument Corporation, Horsham, PA (US)

( * ) Notice: Under 35 U.S.C. 154(b), the term of this patent shall be extended for 0 days.

(21) Appl. No.: 09/356,953

(22) Filed: Jul. 19, 1999

(51) Int. Cl.$^7$ ...................................................... H03B 5/00
(52) U.S. Cl. ...................................... 331/117 FE; 331/77
(58) Field of Search ............................... 331/117 FE, 77, 331/34, 36 C, 117 V, 117 R

(56) References Cited

U.S. PATENT DOCUMENTS

| | | | |
|---|---|---|---|
| 3,439,287 | * 4/1969 | Krueger et al. | 331/47 |
| 4,621,241 | 11/1986 | Kiser | 331/117 R |
| 5,600,279 | * 2/1997 | Mori | 331/36 C |
| 6,008,702 | * 12/1999 | Yamamoto | 331/179 |
| 6,046,650 | * 4/2000 | Lichterfield | 332/123 |

* cited by examiner

Primary Examiner—Robert Pascal
Assistant Examiner—Henry Choe
(74) Attorney, Agent, or Firm—Mayer, Fortkort & Williams, LLC; Karin L. Wiliiams

(57) ABSTRACT

An oscillator is formed using a Field-Effect Transistor (FET) in a Colpitts configuration. The circuit has a resistor from source to ground. Also connected to the source are two capacitors, one between the source and ground while the other is from source to gate. These capacitors provide a phase-shifted feedback signal to the gate. Also connected to the gate is the varactor tank, which has a voltage variable reactance that is used to tune the oscillation to the desired frequency. Between the drain of the FET and the supply voltage is a resistor-capacitor network. Between two series resistors a shunt capacitor is added to minimize local oscillator leakage onto the Vdd line. The resistor network also provides impedance for the Pre-Scalar output, which is simply a connection to the drain of the FET. The pre-scalar output is used to provide a reference signal to the phase-locked loop, which generates the correction voltage to the oscillator's VCO input. It is at the pre-scalar output that a filter network is added to reduce the base-band noise from the Vdd line. By adding a shunt network, consisting of a small inductor and a low ESR capacitor, the supply noise is filtered without reducing the voltage or current supplied to the oscillator. The inductor removes the shunt capacitance at the oscillation frequency, avoiding any reduction in signal to the phase-locked loop circuit. The low ESR capacitor works with the resistance on-chip between the Vdd line and the drain to reduce the low frequency noise present at the FET's drain. This reduction in low-frequency noise results in improved phase noise performance without degrading any other circuit parameters.

20 Claims, 1 Drawing Sheet

ON-CHIP OSCILLATOR WITH PRE-SCALAR FILTER

ON-CHIP OSCILLATOR WITH PRE-SCALAR FILTER

LOW PHASE-NOISE VOLTAGE CONTROLLED OSCILLATOR

BACKGROUND OF THE INVENTION

The present invention relates generally to voltage-controlled oscillators (VCOs), and more particularly a voltage-controlled oscillator for use in a communications device, such as a modulator or receiver.

In all VCO's, phase noise degrades the performance of the VCO. Newer designs of VCOs have improved the phase noise performance, consequently previously unimportant contributions to the phase noise are now more significant. It is therefore desirable to further reduce the phase noise.

One technique for reducing the phase noise is to provide an external (i.e., off-chip) filter on the supply voltage line. For example, a resistor-capacitor combination (R/C) can be coupled externally to the power supply line. However, this technique reduces the supply voltage or the supply current for a given supply voltage to the VCO, thereby degrading performance of the VCO.

Alternatively, it has been attempted to add an external inductor-capacitor (L/C) combination to avoid the voltage drop inherent in the above device. Unfortunately, this technique results in little improvement below the cutoff frequency ($f_c$) of the device, resulting in unrealistic component values.

Another technique for reducing phase noise is disclosed in U.S. Pat. No. 4,621,241, in which elaborate arrangements are made to reduce the phase noise. To improve the phase noise of the circuit, a series capacitor is included in a feedback loop, which includes impedance not present in the Colpitts or Clapp oscillators. Additional impedance (in the form of a resistor) is connected between the feedback output of the amplifier and ground. In this patent, low-pass filtering of noise is accomplished using a resistor to ground and a blocking capacitor in the feedback path. However, the values of the blocking capacitor and resistor used for the filter must be selected for a variety of purposes, which requires the circuit designer to choose less than the optimum values for these elements depending on the requirements of the circuit.

The present invention is therefore directed to the problem of developing a method and apparatus for improving the phase noise performance of a VCO without reducing the supply voltage or the supply current to the VCO.

SUMMARY OF THE INVENTION

The present invention solves this problem by providing a shunt inductor-capacitor series combination to a pre-scalar port, which is directly connected to the drain of the oscillator FET. In combination with resistance between the supply voltage Vcc and the FET's drain, the resulting resistor/capacitor combination can significantly improve the phase noise performance without degrading other parameters and without additional changes to the integrated circuit.

According to one aspect of the present invention, the inductor should have high impedance over the frequency range of the oscillator.

According to another aspect of the present invention, the capacitor should be a low equivalent series resistance (ESR), high capacitance component. One example of such a capacitor is a tantalum capacitor.

According to yet another aspect of the present invention, a voltage-controlled oscillator includes a field-effect transistor, a prescalar output port coupled to the drain of the field-effect transistor, a capacitor coupled between the prescalar output port and the drain of the field-effect transistor, and a filter coupled between the drain and the pre-scalar capacitor to ground.

According to another aspect of the present invention, the filter used in the voltage-controlled oscillator preferably includes an inductor and a capacitor coupled in series.

According to another aspect of the present invention, the voltage-controlled oscillator preferably includes a resistor coupled between the drain and a voltage source.

Alternatively, the voltage-controlled oscillator includes two resistors coupled in series with one resistor coupled to the voltage source and the other resistor coupled to the drain. In this alternative embodiment, the voltage-controlled oscillator preferably includes a capacitor coupled to the series resistors and to ground.

According to another aspect of the present invention, the voltage-controlled oscillator preferably includes a resistor coupled to a voltage source and a gate of the field-effect transistor.

According to yet another aspect of the present invention, a method for improving phase noise performance of a voltage-controlled oscillator fabricated on an integrated circuit, includes the steps of: coupling an on-chip resistor between a supply line and the integrated circuit, and coupling a large, off-chip capacitor between the resistor and ground to filter noise from the supply line.

According to yet another aspect of the present invention, the above method preferably includes the step of coupling an off-chip inductor in series with the large capacitor.

According to yet another aspect of the present invention, the above method preferably includes the step of coupling the large capacitor to a pre-scalar output port through an inductor.

According to yet another aspect of the present invention, in an oscillator including a transistor in a Colpitts configuration formed on an integrated circuit, a method for reducing phase noise includes the steps of coupling a resistor-capacitor network between a supply voltage source and the transistor, and coupling a filter to the transistor and to ground.

According to another aspect of the present invention, the above method preferably includes the step of coupling the filter to a pre-scalar output port on the integrated circuit.

According to another aspect of the present invention, the above method preferably includes mounting the filter off-chip.

According to yet another aspect of the present invention, an oscillator includes a field-effect transistor in a Colpitts configuration, a resistor coupled from the source to ground, a capacitor coupled between the source and the gate, another capacitor coupled between the source and ground. In this embodiment, the two capacitors provide a phase-shifted feedback signal to the gate. The oscillator further includes a varactor tank coupled to the gate, which varactor tank has a voltage variable reactance that is used to tune oscillation of the oscillator to a desired frequency. The oscillator also includes a voltage source and a resistor-capacitor network coupled between the drain and the voltage source.

According to another aspect of the present invention, the resistor-capacitor network of the above oscillator preferably includes two resistors coupled in series and a shunt capacitor coupled to the two resistors and to ground. In this embodiment, the shunt capacitor minimizes local oscillator leakage onto the supply voltage line.

According to another aspect of the present invention, the above oscillator further includes a voltage-controlled oscillator input, a phase-locked loop generating a correction voltage output to the voltage-controlled oscillator input, and a pre-scalar output port coupled to the drain and the phase-locked loop. In this embodiment, the pre-scalar output provides a reference signal to the phase-locked loop.

According to another aspect of the present invention, the above oscillator preferably includes a filter network coupled to the pre-scalar output port reducing base-band noise from the supply voltage line. One possible implementation of the filter network includes a shunt network.

According to another aspect of the present invention, the shunt network of the above oscillator preferably includes a small inductor and a low equivalent source resistance capacitor. In this embodiment, supply noise is filtered without reducing voltage or current supplied to the oscillator.

According to yet another aspect of the present invention, inductor of the above oscillator removes the shunt capacitance at an oscillation frequency, avoiding any reduction in signal to the phase-locked loop circuit.

According to another aspect of the present invention, in the above oscillator, the low ESR capacitor works with resistance on-chip between the supply voltage line and the drain to reduce low frequency noise present at the drain, which reduction in low-frequency noise results in improved phase noise performance without degrading any other parameters.

According to another aspect of the present invention, one possible embodiment of the inductor in the above oscillator is a printed transmission-line or equivalent circuit, which is inductive over the oscillator's operating range.

According to another aspect of the present invention, one possible embodiment of the capacitor is a large ceramic, film or tantalum capacitor with a large capacitance value and low equivalent series resistance.

According to another aspect of the present invention, in the above oscillator, a combined resistance of the two resistors is preferably approximately equal to:

(Supply Voltage—Drain Voltage)/ Current Consumption= Combined Resistance.

According to another aspect of the present invention, in the above oscillator, the inductor preferably has an inductance at least approximately:

a circuit reactance/($2\Pi \times$a low end operating frequency), and minimal series resistance.

According to another aspect of the present invention, in the above oscillator, the capacitor has a low reactance above at least approximately 1 kHz, and the reactance of the capacitor is approximately equal to or lower in magnitude, over a frequency of interest, than the equivalent series resistance. For example, the magnitude of the reactance can be greater than $3 \times Z_o$, with $Z_o$ typically being 50 ohms.

According to another aspect of the present invention, in the above oscillator, the resistor has a resistance of approximately 20 ohms, and the capacitor has a capacitance of approximately 15 micro-farads.

According to yet another aspect of the present invention, an apparatus for reducing phase noise in an oscillator having a transistor and being formed on an integrated circuit, includes on-chip and off-chip means for filtering noise on a supply line of the integrated circuit, as well as means for minimizing local oscillator leakage onto the supply line. The minimizing means is located on-chip. Furthermore, the on-chip and off-chip means combine to reduce low frequency noise present at the drain of the transistor. The reduction in low-frequency noise results in improved phase noise performance without degrading any other parameters.

According to yet another aspect of the present invention, the off-chip means includes means for removing any shunt capacitance at an oscillation frequency, thereby avoiding any reduction in signal to a phase-locked loop circuit.

BRIEF DESCRIPTION OF THE DRAWINGS

The above-mentioned and other objects, features and advantages of the present invention will become more apparent from the following detailed description when taken in conjunction with the accompanying drawings, wherein.

DETAILED DESCRIPTION

Figure 1:
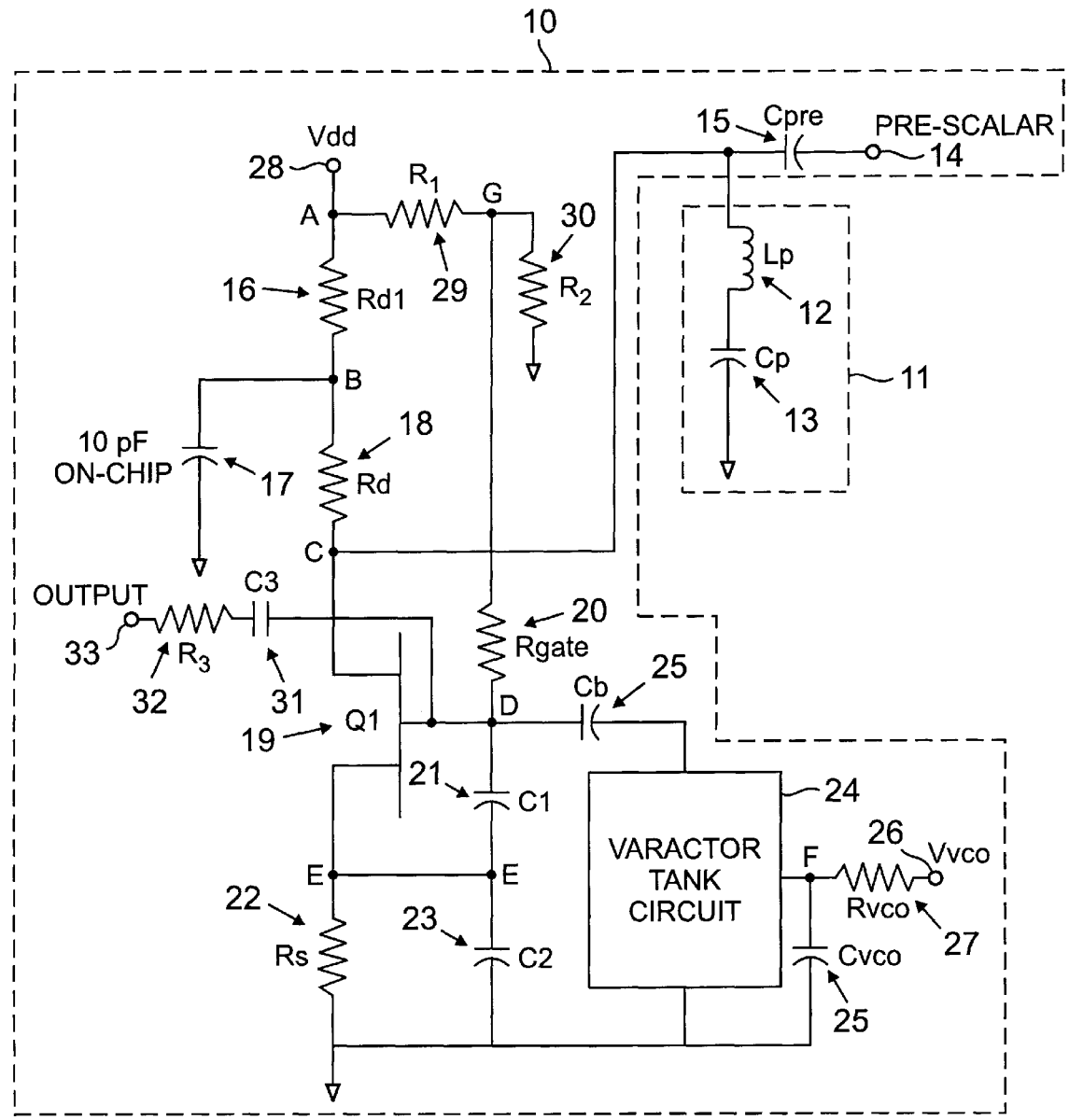
FIG. 1 depicts an exemplary embodiment of an apparatus according to the present invention.

The present invention provides a resistor between the supply line (i.e., the noise source), and the integrated circuit (i.e., the VCO) along with a large capacitance coupled to ground to filter the noise from the supply. The amount of filtering is determined by the ratio of (Rd1+Rd)/Rcp where Rcp is the Equivalent Series Resistance (ESR) of capacitor Cp as shown in FIG. 1. In contrast to prior art patent U.S. Pat. No. 4,621,241, which must size the resistor and capacitor used to filter noise (i.e., R4 and C5 in FIG. 1 of this patent) for a number of reasons, including the performance of the oscillator circuit, the present invention enables the selection of the value of the capacitance (Cp) used to filter the noise only to improve noise filtering. Consequently, the present invention has significantly improved phase noise performance. Moreover, the present invention does not impact the oscillator circuit in any other way such a bias levels, supply voltage, output power, or circuit configuration.

Referring to FIG. 1, shown therein is an on-chip oscillator 10 with a pre-scalar filter 11, which consists of inductor Lp 12 and capacitor Cp 13 coupled in series. Between node C and the pre-scalar output 14 is a pre-scalar capacitor Cpre 15. The pre-scalar filter 11 is connected between node C and ground.

The voltage supply Vdd 28 is connected to node A. Between node A and node B is resistor Rd1 16. Between node A and node G is resistor R1 29 and between node G and ground is resistor R2 30. Capacitor 17 is connected between node B and ground, one exemplary embodiment of which is a 10 pF capacitor on the integrated circuit.

Connected between node B and C is a resistor Rd 18. Node C is also connected to the drain of FET Q1 19. Connected between node D, which is coupled to the gate of FET Q1 19, and node D is resistor Rgate 20. Connected between node D and node E is capacitor C1 21. Node E is also connected to the source of FET Q1 19. Node E is coupled to ground via resistor Rs 22 and capacitor C2 23 in parallel.

Node D is coupled to varactor tank circuit 24 via capacitor Cb 25. The varactor tank circuit 24 is also coupled to ground. The output of the tank circuit 24 is coupled to Node F, which is coupled to ground via capacitor Cvco 25. Node F is also coupled to the output of the circuit Vvco 26 via resistor Rvco 27.

According to the present invention, filtering the supply voltage to remove low frequency noise on the Vdd line prevents degradation of the oscillator FET's phase noise performance.

The present invention requires no changes to the integrated device, no change to the voltage supply circuitry, does not degrade any other performance parameters, and adds minimal components and cost. Moreover, the present invention allows for further improvement in phase noise performance.

According to the present invention, an oscillator is formed using a Field-Effect Transistor (FET) in a Colpitts configuration. The circuit has a resistor Rs from source to ground. Also connected to the source are two capacitors, C1 and C2, one (C2) is between the source and ground while the other (C1) is from source to gate. These capacitors (C1, C2) provide a phase-shifted feedback signal to the gate. Also connected to the gate is the varactor tank 24, which has a voltage variable reactance that is used to tune the oscillation to the desired frequency. Between the drain of the FET and the supply voltage is a resistor-capacitor network (Rd1, Rd and a shunt capacitor, e.g., 10 pF).

Between two series resistors (Rd1, Rd), a shunt capacitor (e.g., 10 pF) is added to minimize local oscillator (LO) leakage onto the Vdd line.

The resistor network (Rd1, Rd) also provides impedance for the Pre-Scalar output, which is simply a connection to the drain of the FET 19. The pre-scalar output is used to provide a reference signal to the phase-locked loop, which generates the correction voltage to the oscillator's VCO input. According to the present invention, it is at the pre-scalar output that a filter network is added to reduce the base-band noise from the Vdd line.

The output 33 of the oscillator 10 is connected to the gate node D, through a series resistor R3 32 and blocking capacitor C3 31.

By adding a shunt network, consisting of a small inductor (Lp) and a low ESR capacitor (Cp), the supply noise is filtered without reducing the voltage or current supplied to the oscillator. The inductor (Lp) removes the shunt capacitance at the oscillation frequency, avoiding any reduction in signal to the phase-locked loop circuit. The low ESR capacitor works with the resistance on-chip between the Vdd line and the drain to reduce the low frequency (i.e., base-band) noise present at the FET's drain. This reduction in low-frequency noise results in improved phase noise performance without degrading any other parameters.

Other embodiments are possible. For example, Rd1 and Rd could be combined into a single resistor.

Alternatively, R1 29 could be connected between Rd1 and Rd which may reduce noise present on the gate.

Furthermore, R1 29 could be connected at the FET's drain (where Lp and Cpre are connected). Furthermore, a large capacitor could be added to node G.

One possible implementation of the inductance used in the present invention (Lp) could be a printed transmission-line or equivalent circuit, which is inductive over the oscillator's operating range.

One possible implementation of the capacitance used in the present invention (Cp) could be a large ceramic capacitor, film, tantalum, or similar capacitor with a large capacitance value and low Equivalent Series Resistance (ESR).

To implement the present invention in the circuit depicted in FIG. 1, some exemplary values for the elements of the circuit are provided. Other values are possible, as would be apparent to those of skill in the art.

For example, resistors Rd1 and Rd are limited by the supply voltage and current requirements of the device. For a +5V supply, a current consumption of 60 mA, and a drain voltage of 4 volts, the combined resistance can only be: (5V−4V)/60 mA=16.67 ohms. Increasing these resistors will lower either the drain voltage or the current which will reduce the output power and possibly degrade other parameters.

In addition, for example, the inductor Lp needs to be inductive over the frequency range of the oscillator. If the oscillator operates from 1 to 2 GHz and a reactance of 300 ohms or greater is desired, a minimal inductance of 300 ohms/($2\Pi \times 1 \times 10^{09}$) or 47.7 nH is required. This inductor should have minimal series resistance.

Moreover, for example, the capacitor Cp needs to have a low reactance over the region in which one is trying to improve phase noise. This range is typically above 1 KHz but since it is desirable to improve this region by several dB, the cutoff frequency of the R/C combination should be as low as possible. The capacitor's reactance should be equal to or lower in magnitude, in the frequency of interest, than the ESR in order to achieve the desired improvement. One possible implementation of the resistor and capacitor is: Example: R=20 ohms, C=15 uF.

In this exemplary embodiment, the cutoff frequency is $1/(2 \times \Pi \times R \times C) = 530$ Hz where the R/C filter will reduce the noise at the output of the filter by 3 dB. At 5,300 Hz, the R/C filter will reduce the noise at the output by an additional 20 db or 23 dB. The reactance at 5,300 Hz is now 2 ohms. The slope of this attenuation is 6 dB per octave (double the frequency) and 20 dB per decade. The maximum attenuation is limited by the capacitor's Equivalent Series Resistance (ESR). This resistance creates a voltage divider which will limit the attenuation to 10 log(ESR/(Rd1+Rd+ESR)). As Cp's ESR is decreased the maximum potential attenuation is increased.

One possible implementation of a capacitor with low ESR is a tantalum capacitor.

In sum, the present invention allows for further reductions in supply voltage and enable further improvements in phase noise performance without limiting the performance of the VCO.

Moreover, the above-described method of the present invention should also apply to a bipolar transistor having a collector, base, and emitter instead of a drain, gate, and source, respectively.

Although various embodiments are specifically illustrated and described herein, it will be appreciated that modifications and variations of the present invention are covered by the above teachings and within the purview of the appended claims without departing from the spirit and scope of the invention.

What is claimed is:

1. A voltage controlled oscillator comprising:
    a) a transistor having a terminal and receiving an input signal by an input signal path;
    b) a prescalar output port being coupled to the terminal of the transistor;
    c) a first capacitor being coupled between the prescalar output port and the terminal of the transistor; and
    d) a filter having one end coupled between the input signal path and the terminal and the first capacitor and the other end coupled to ground,
        wherein the filter includes an inductor and a second capacitor having a low equivalent source resistance coupled in series, and
        further wherein the filter, together with a resistance coupled between a power source and the terminal, reduces low frequency noise.

2. The voltage controlled oscillator according to claim 1, further comprising:

a) a voltage source outputting a supply voltage; and b) a first resistor coupled between the terminal and the voltage source.

3. The voltage controlled oscillator according to claim 1, further comprising:

a) a voltage source outputting a supply voltage;

b) a first resistor having a first end coupled to the voltage source, and having a second end; and c) a second resistor having a first end coupled to the second end of the first resistor and having a second end coupled to the terminal.

4. The voltage controlled oscillator according to claim 3, further comprising a third capacitor having a first end coupled to the second end of the first resistor and coupled to the first end of the second resistor, said third capacitor having a second end coupled to ground.

5. The voltage controlled oscillator according to claim 3, further comprising a third resistor coupled to the voltage source, wherein the transistor further comprises a second terminal coupled to the third resistor.

6. The voltage controlled oscillator according to claim 4, further comprising a third resistor having a first end coupled to the first end of the first resistor, wherein the transistor further comprises an additional terminal and the third resistor has a second end coupled to the additional terminal of the transistor.

7. The voltage controlled oscillator according to claim 1, wherein the transistor comprises a field effect transistor and the terminal comprises a drain.

8. The voltage controlled oscillator according to claim 1, wherein the transistor comprises a bipolar transistor and the terminal comprises a collector.

9. The voltage controlled oscillator according to claim 5, wherein the transistor comprises a field-effect transistor, the terminal comprises a drain and the second terminal comprises a gate.

10. The voltage controlled oscillator according to claim 5, wherein the transistor comprises a bipolar transistor, the terminal comprises a collector, and the second terminal comprises a base.

11. The voltage controlled oscillator according to claim 6, wherein the transistor comprises a field-effect transistor, the terminal comprises a drain and the additional terminal comprises a gate.

12. The voltage controlled oscillator according to claim 6, wherein the transistor comprises a bipolar transistor, the terminal comprises a collector, and the additional terminal comprises a base.

13. In an oscillator including a transistor, the transistor having a terminal and receiving an input signal by an input signal path, in a Colpitts configuration formed on an integrated circuit, a method for reducing phase noise comprising the steps of:

a) coupling a resistor-capacitor network between a supply voltage source and the transistor;

b) coupling one end of a filter between the input signal path and the terminal of the transistor and the other end to ground; and c) coupling the filter to a pre-scalar output port on the integrated circuit,
wherein the step of coupling the filter to the pre-scalar output port includes mounting the filter off-chip, and further wherein the filter, together with the resistor-capacitor network coupled between the supply voltage source and the terminal, reduces phase noise.

14. An oscillator comprising:

a) a field-effect transistor in a Colpitts configuration, said transistor including a source, a drain and a gate and receiving an input signal at the drain by an input signal path;

b) a resistor coupled from the source to ground;

c) a first capacitor coupled between the source and the gate;

d) a second capacitor coupled between the source and ground, wherein said first and second capacitors provide a phase-shifted feedback signal to the gate;

e) a varactor tank coupled to the gate, said varactor tank having a voltage variable reactance that is used to tune oscillation of the oscillator to a desired frequency;

f) a voltage source providing a supply voltage and having a supply voltage line and providing the input signal through the input signal path;

g) a resistor-capacitor network coupled between the drain and said voltage source; and h) a filter network comprising a shunt network and having one end coupled to the drain, the shunt network including a small inductor and a low equivalent source resistance capacitor, whereby supply noise is filtered by said filter network and said resistor-capacitor network without reducing voltage or current supplied to the oscillator.

15. The oscillator according to claim 14, wherein the resistor-capacitor network comprises two resistors coupled in series and a shunt capacitor coupled to the two resistors and to ground, wherein said shunt capacitor minimizes local oscillator leakage onto the supply voltage line.

16. The oscillator according to claim 15, further comprising:

a) a voltage-controlled oscillator input;

b) a phase-locked loop generating a correction voltage output to the voltage-controlled oscillator input; and c) a pre-scalar output port coupled to the drain and the phase-locked loop, wherein said pre-scalar output provides a reference signal to the phase-locked loop.

17. The oscillator according to claim 16, wherein the filter network is coupled to the pre-scalar output port reducing base-band noise from the supply voltage line.

18. The oscillator according to claim 14, wherein the inductor comprises a printed transmission-line, which is inductive over the oscillator's operating range.

19. The voltage controlled oscillator according to claim 4, further comprising a third resistor having a first end coupled to the second end of the first resistor and coupled to the first end of the second resistor, wherein the transistor further comprises an additional terminal and the third resistor has a second end coupled to the additional terminal of the transistor.

20. The voltage controlled oscillator according to claim 4, further comprising a third resistor having a first end coupled to the second end of the second resistor, wherein the transistor further comprises an additional terminal and the third resistor has a second end coupled to the additional terminal of the transistor.

* * * * *